(12) United States Patent
Berry et al.

(10) Patent No.: US 9,449,022 B2
(45) Date of Patent: Sep. 20, 2016

(54) RANKING AND DISPLAYING APPRAISER-CHOSEN COMPARABLES AGAINST MODEL-CHOSEN COMPARABLES

(75) Inventors: Megan C. Berry, Rockville, MD (US); Alexei M. Kisselev, Burke, VA (US); Eric Rosenblatt, Derwood, MD (US); WenXiong Yao, Rockville, MD (US); Felix G. Meale, North Bethesda, MD (US); Adam Davis, Arlington, VA (US)

(73) Assignee: Fannie Mae, Washington, DC (US)

( * ) Notice: Subject to any disclaimer, the term of this patent is extended or adjusted under 35 U.S.C. 154(b) by 878 days.

(21) Appl. No.: 12/929,621

(22) Filed: Feb. 4, 2011

(65) Prior Publication Data

US 2012/0203771 A1   Aug. 9, 2012

(51) Int. Cl.
*G06F 17/30* (2006.01)
*G06Q 50/16* (2012.01)

(52) U.S. Cl.
CPC ....... *G06F 17/30241* (2013.01); *G06Q 50/163* (2013.01)

(58) Field of Classification Search
CPC .................. G06F 17/30864; G06F 17/30867; G06Q 50/163
USPC .......................................... 707/723; 705/313
See application file for complete search history.

(56) References Cited

U.S. PATENT DOCUMENTS

| | | | |
|---|---|---|---|
| 5,361,201 A | 11/1994 | Jost et al. | |
| 5,857,174 A * | 1/1999 | Dugan | 705/313 |
| 5,966,700 A | 10/1999 | Gould et al. | |
| 7,099,843 B1 | 8/2006 | Cassidy et al. | |
| 7,289,965 B1 | 10/2007 | Bradley et al. | |
| 7,340,431 B1 | 3/2008 | McManus et al. | |
| 7,451,095 B1 | 11/2008 | Bradley et al. | |
| 7,509,261 B1 | 3/2009 | McManus et al. | |
| 7,593,890 B1 | 9/2009 | Bradley et al. | |
| 7,647,272 B1 | 1/2010 | Muren | |
| 7,693,764 B1 | 4/2010 | Gordon et al. | |
| 7,711,574 B1 | 5/2010 | Bradley et al. | |
| 7,792,742 B1 | 9/2010 | Thomas et al. | |
| 7,797,166 B1 | 9/2010 | Bradley et al. | |
| 7,835,919 B1 | 11/2010 | Bradley et al. | |
| 7,882,025 B1 | 2/2011 | Seal et al. | |
| 7,904,381 B1 | 3/2011 | Tatang et al. | |

(Continued)

OTHER PUBLICATIONS

Ottensmann et al. (Urban Location and Housing Prices within a Hedontic Model; The Journal of Regional Analysis and Policy, 2008.*

(Continued)

*Primary Examiner* — Mahesh Dwivedi
(74) *Attorney, Agent, or Firm* — Michael Best & Friedrich LLP

(57) ABSTRACT

Ranking and displaying comparable properties entails receiving appraisal information comprising a subject property and appraiser-chosen comparable properties corresponding to the subject property. Property data corresponding to a geographical area is accessed, in support of determining model-chosen comparable properties based upon the appropriateness of each of the comparable properties as comparables for the subject property. A map image is displayed for the geographical area, along with indicators on the map image indicative of the subject property, at least one of the appraiser-chosen comparable properties, and at least one of the model-chosen comparable properties.

15 Claims, 7 Drawing Sheets

(56) References Cited

U.S. PATENT DOCUMENTS

| | | | |
|---|---|---|---|
| 7,941,365 B1 | 5/2011 | Bradley et al. | |
| 7,941,366 B1 | 5/2011 | Bradley et al. | |
| 7,945,510 B1 | 5/2011 | Bradley et al. | |
| 7,974,854 B1 | 7/2011 | Bradley et al. | |
| 7,987,137 B1 | 7/2011 | Thomas et al. | |
| 7,996,304 B1 | 8/2011 | Thomas et al. | |
| 7,996,313 B1 | 8/2011 | Mcmurray et al. | |
| 8,010,377 B1 | 8/2011 | Bradley et al. | |
| 8,046,306 B2 | 10/2011 | Stinson | |
| 8,108,302 B1 | 1/2012 | Bradley et al. | |
| 8,140,421 B1 | 3/2012 | Humphries et al. | |
| 8,209,258 B1 | 6/2012 | Seal et al. | |
| 8,239,318 B1 | 8/2012 | Bradley et al. | |
| 8,244,563 B2 | 8/2012 | Coon et al. | |
| 8,255,320 B1 | 8/2012 | Seal et al. | |
| 8,280,806 B1 | 10/2012 | Bradley et al. | |
| 8,326,749 B1 | 12/2012 | Seal et al. | |
| 8,386,395 B1 | 2/2013 | Gordon et al. | |
| 8,401,868 B1 | 3/2013 | Bradley et al. | |
| 8,401,961 B1 | 3/2013 | Mcmurray et al. | |
| 8,447,688 B1 | 5/2013 | Thomas et al. | |
| 8,521,644 B1 | 8/2013 | Hanson et al. | |
| 2001/0039506 A1* | 11/2001 | Robbins | 705/10 |
| 2005/0154656 A1 | 7/2005 | Kim et al. | |
| 2005/0154657 A1* | 7/2005 | Kim et al. | 705/30 |
| 2008/0004893 A1 | 1/2008 | Graboske | |
| 2008/0162224 A1* | 7/2008 | Coon et al. | 705/7 |
| 2008/0288335 A1* | 11/2008 | Goldberg | 705/10 |
| 2009/0187438 A1* | 7/2009 | Selberg | 705/7 |

OTHER PUBLICATIONS

Ottensmann et al. (Urban Location and Housing Prices within a Hedontic Model; The Journal of Regional Analysis and Policy, 2008).*

Vandell, Kerry D. "Optimal Comparable Selection and Weighting in Real Property Valuation" AREUEA Journal, vol. 19, No. 2, 1991, pp. 213-239.

Gau, George W., et al. "Optimal Comparable Selection and Weighting in Real Property Valuation: An Extension" Journal of the American Real Estate and Urban Economics Association vol. 20, No. 1, 1992, pp. 107-123.

* cited by examiner

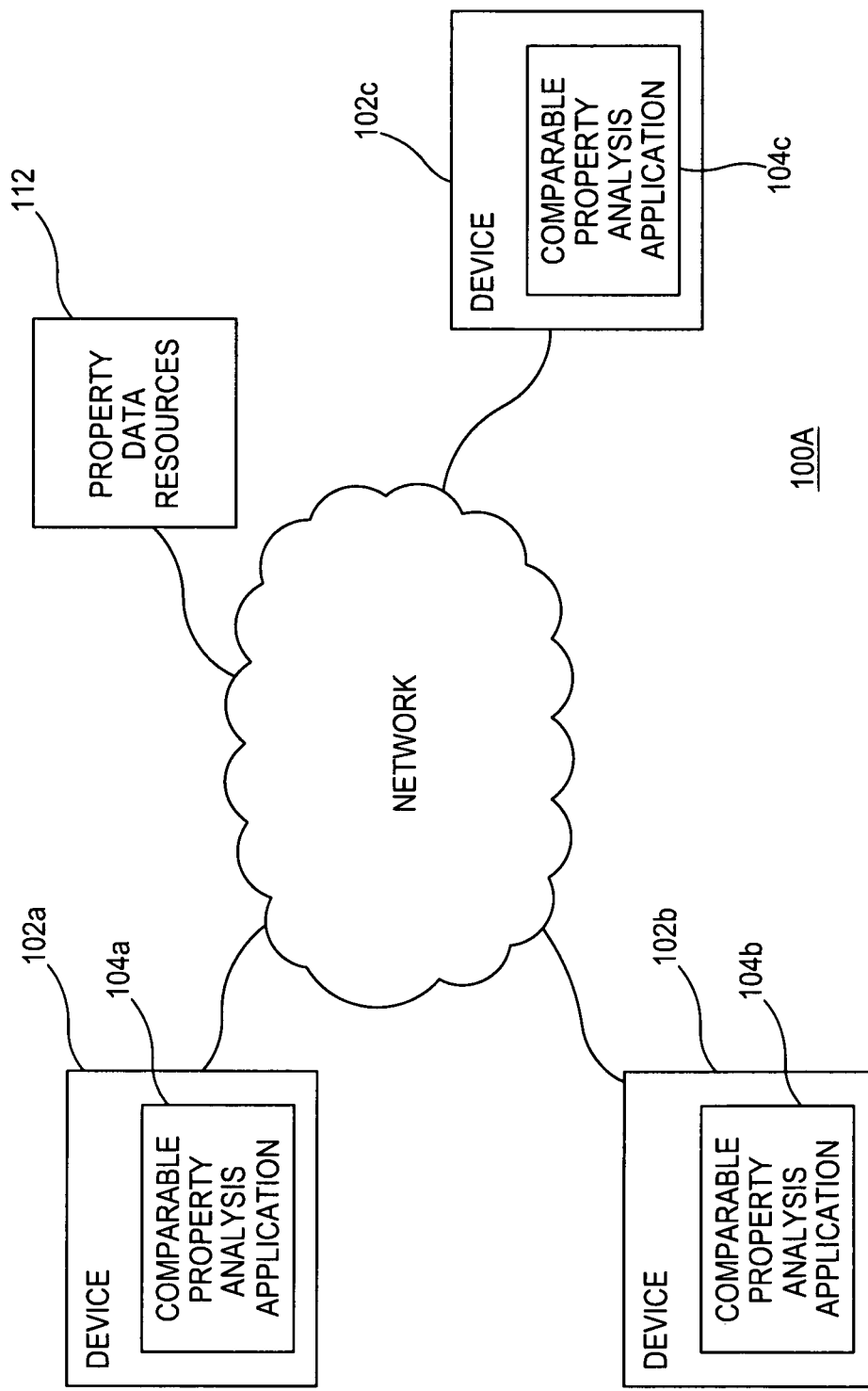

FIG.5A

COMPARABLE PROPERTY ANALYSIS

| Fcl | Address | Age | Lot | Sqft | Bed | Bath | GD | Sale Dt | Sale $ | Appraisal |
|---|---|---|---|---|---|---|---|---|---|---|
| S | [Subject Property] | 25 | 3102 | 2325 | 3 | 3 | 0 | | | $326,600 |
| AS | [Appraisal Comp #1] | 13 | 7752 | 1703 | 3 | 2 | 1.81 | 2010-03-27 | $301,000 | $319,870 |
| AS | [Appraisal Comp #2] | 13 | 6384 | 2158 | 3 | 2 | 1.52 | 2010-03-28 | $309,000 | $311,615 |
| AS | [Appraisal Comp #3] | 13 | 7797 | 1855 | 3 | 2 | 1.51 | 2010-01-25 | $318,000 | $331,350 |

RANKING AND DISPLAYING APPRAISER-CHOSEN COMPARABLES AGAINST MODEL-CHOSEN COMPARABLES

BACKGROUND OF THE INVENTION

1. Field of the Invention

This application relates to assessment of comparable properties and more particularly to assessing appraiser-chosen comparables against model-chosen comparables and other parameters.

2. Description of the Related Art

Appraisals are traditionally performed by human appraisers who assess a subject property and apply various factors to identify a set of comparable properties against which the value of the subject property may be compared. The results may be described in an appraisal report listing the comparable properties.

Appraisals may be variously used in connection with transactions including loan approval as well as downstream transactions. Appraisal reports may be reviewed in connection with the approval of transactions. They may also be reviewed at other times, such as to assess the appraisal, to identify the possibility of a fraudulent transaction, or to assess the work of an appraiser. Traditionally, this might be performed by an assessor who reviews the report, perhaps does some investigation, and then assesses the results.

The traditional techniques for reviewing and assessing appraisals are inconsistent and do not lend themselves to large scale review.

What is needed are techniques for quickly and accurately reviewing and assessing appraisals and corresponding appraisal reports.

SUMMARY OF THE INVENTION

Ranking and displaying comparable properties entails receiving appraisal information comprising a subject property and appraiser-chosen comparable properties corresponding to the subject property. Property data corresponding to a geographical area is accessed, in support of determining model-chosen comparable properties based upon the appropriateness of each of the comparable properties as comparables for the subject property. A map image is displayed for the geographical area, along with indicators on the map image indicative of the subject property, at least one of the appraiser-chosen comparable properties, and at least one of the model-chosen comparable properties.

A first indicator type may be used for displaying the appraiser-chosen comparable properties on the map image, and a second indicator type different from the first indicator type may be used for displaying the model-chosen comparable properties, to offer an immediate visual distinction between the types of properties.

Additionally, a ranked listing of comparable properties including the plurality of model-chosen comparable properties and the plurality of appraiser-chosen comparable properties may also be determined, with the ranked listing of comparable properties being displayed concurrently alongside the map image.

Still further, determining the plurality of model-chosen comparable properties may include performing a regression based upon the property data, the regression modeling the relationship between price and explanatory variables, identifying candidate comparable properties within the geographic area, determining a set of value adjustments for the potential comparable properties based upon differences in the explanatory variables between the subject property and the candidate comparable properties, and determining an economic distance between the subject property and respective ones of the candidate comparable properties, the economic distance constituted as a quantified value determined from the set of value adjustments for each respective comparable property, wherein the ranked listing of comparable properties is determined based upon a weighting of the candidate comparable properties based upon the economic distance from the subject property.

The present invention can be embodied in various forms, including business processes, computer implemented methods, computer program products, computer systems and networks, user interfaces, application programming interfaces, and the like.

BRIEF DESCRIPTION OF THE DRAWINGS

These and other more detailed and specific features of the present invention are more fully disclosed in the following specification, reference being had to the accompanying drawings, in which:

FIGS. 1A-B are block diagrams illustrating examples of systems in which a comparable property analysis application operates.

FIG. 5A is a display diagram illustrating an example of a map image and corresponding property grid data for a list of appraiser-chosen comparable properties.

DETAILED DESCRIPTION OF THE INVENTION

Figure 1B:
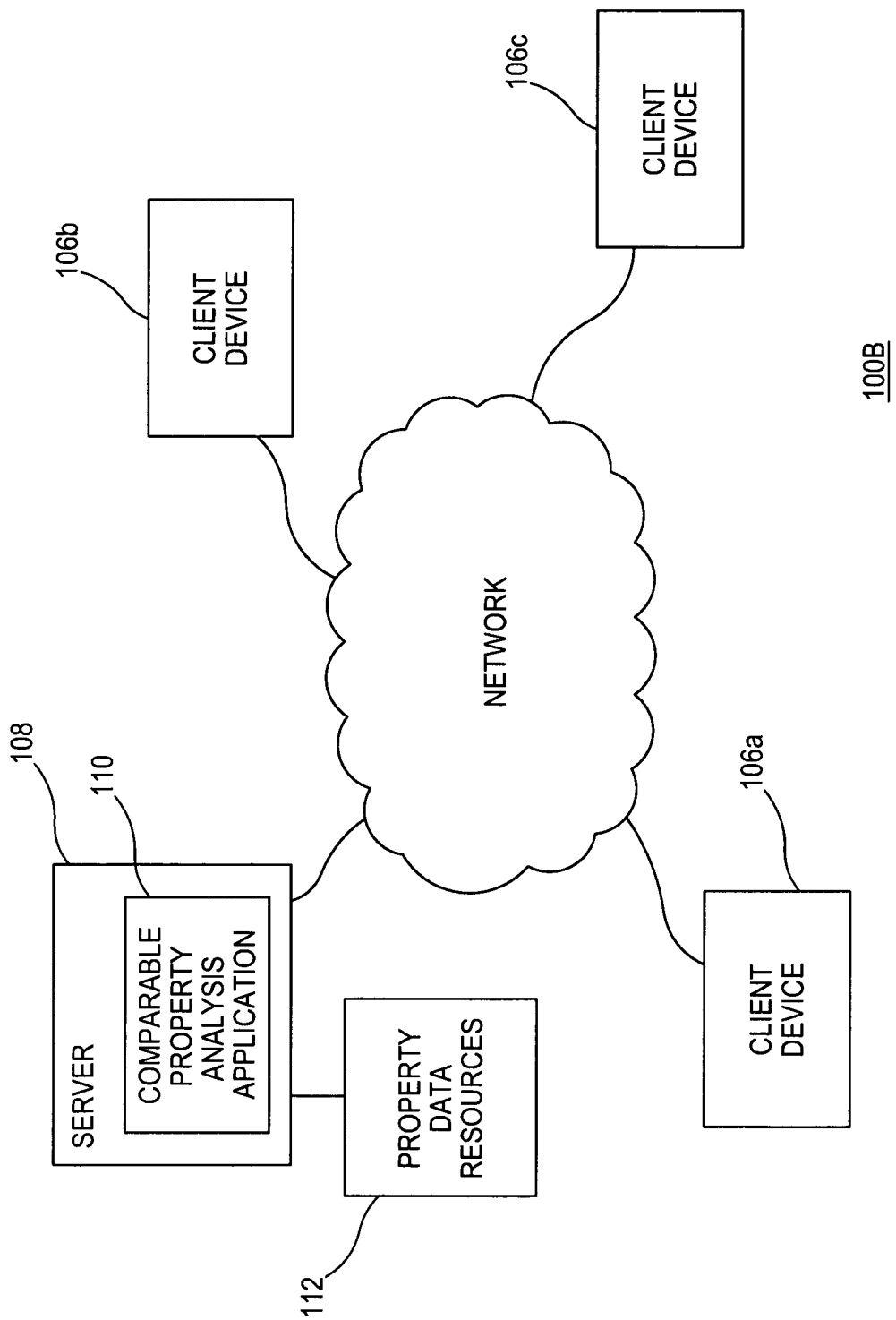

In the following description, for purposes of explanation, numerous details are set forth, such as flowcharts and system configurations, in order to provide an understanding of one or more embodiments of the present invention. However, it is and will be apparent to one skilled in the art that these specific details are not required in order to practice the present invention.

According to one aspect, the present invention facilitates retrieval of a set of appraiser-chosen comparable properties, for comparison to model-chosen comparable properties, alongside map images and associated information useful for reviewing and assessing the appraiser-chosen comparable properties.

For example, the set of appraiser-chosen comparable properties may be retrieved and listed among model-chosen comparable properties according to a ranked listing. The ranking indicates how closely the model views all of the comparable properties, and gives an immediate indication where the appraiser-chosen comparable properties reside in the ranked listing.

Various models may be implemented to generate the ranked listing of comparable properties. In one example, the property data is accessed and a regression models the relationship between price and explanatory variables. For example, a hedonic regression is performed at a geographic level (e.g., county) sufficient to produce reliable results. A pool of comparables is identified, such as by initial exclusion rules based upon distance from and other factors in relation to a subject property. A set of adjustments for each comparable is determined using adjustment factors drawn from the regression analysis. These adjustments are then used to derive an economic distance between each comparable and the subject property. For example, the economic distance may be a value indicative of the estimated price difference between a comp and the subject that is determined from the set of adjustments for that comp. The comparables are weighted according to the economic distance, physical distance and time (of sale) between the comparable and the subject property. This weighting determines the ranked listing.

In connection with the display of the ranked listing, a map image is displayed to illustrate the geographic distribution of the subject property and the comparable properties. Thus, in addition to offering the ranked listing that indicates where among the ranking the appraiser-chosen comparables are listed, there is a concurrent display on the map image that gives an immediate indication of the location of the comparable properties (both model-chosen and appraiser-chosen). This allows further assessment as to general proximity between the comparables and the subject property, whether the comparables are in the same or a different neighborhood, where the comparables are located with respect to significant features (highways, schools, bodies of water, etc.), etc.

An associated property data grid further details information about the subject and comparable properties. The grid can be sorted according to a variety of property and other characteristics, and operates in conjunction with the map image to ease review of the comparables and corresponding criteria. The map image may be variously scaled and updates to show the subject property and corresponding comparables in the viewed range, and interacts with the grid (e.g. cursor overlay on comparable property in the map image allows highlighting of additional data in the grid).

(i) Hedonic Equation

Various models may be used to generate the model-chosen comparable properties, including but not limited to one using a hedonic regression technique.

One example of a hedonic equation is described below. In the hedonic equation, the dependent variable is sale price and the explanatory variables can include the physical characteristics, such as gross living area, lot size, age, number of bedrooms and or bathrooms, as well as location specific effects, time of sale specific effects, property condition effect (or a proxy thereof). This is merely an example of one possible hedonic model. The ordinarily skilled artisan will readily recognize that various different variables may be used in conjunction with the present invention.

In this example, the dependent variable is the logged sale price. The explanatory variables are:

(1) Four continuous property characteristics:
(a) log of gross living area (GLA),
(b) log of Lot Size,
(c) log of Age, and
(d) Number of Bathrooms; and
(2) Three fixed effect variables:
(a) location fixed effect (e.g., by Census Block Group (CBG));
(b) Time fixed effect (e.g., measured by 3-month periods (quarters) counting back from the estimation date); and
(c) Foreclosure status fixed effect, which captures the maintenance condition and possible REO discount.

The exemplary equation (Eq. 1) is as follows:

$$\ln(p) = \beta_{gla} \cdot \ln(GLA) + \beta_{lot} \cdot \ln(LOT) + \beta_{age} \cdot \ln(AGE) + \beta_{bath} \cdot BATH + + \sum_{i=1}^{N_{CBG}} LOC_i^{CBG} + \sum_{j=1}^{N_{QTR}} TIME_j + \sum_{k=\{0,1\}} FCL_k + \varepsilon \quad (Eq.\ 1)$$

The above equation is offered as an example, and as noted, there may be departures. For example, although CBG is used as the location fixed effect, other examples may include Census Tract or other units of geographical area. Additionally, months may be used in lieu of quarters, or other periods may be used regarding the time fixed effect. These and other variations may be used for the explanatory variables.

Additionally, although the county may be used for the relatively large geographic area for which the regression analysis is performed, other areas such as a multi-county area, state, metropolitan statistical area, or others may be used. Still further, some hedonic models may omit or add different explanatory variables.

(ii) Exclusion Rules

Comparable selection rules are then used to narrow the pool of comps to exclude the properties which are determined to be insufficiently similar to the subject.

A comparable property should be located in a relative vicinity of the subject and should be sold relatively recently; it should also be of similar size and age and sit on a commensurate parcel of land. The "N" comparables that pass through the exclusion rules are used for further analysis and value prediction.

For example, the following rules may be used to exclude comparables pursuant to narrowing the pool:

(1) Neighborhood: comps must be located in the Census Tract of the subject and its immediate neighboring tracts;
(2) Time: comps must be sales within twelve months of the effective date of appraisal or sale;
(3) GLA must be within a defined range, for example:

$$\frac{2}{3} \leq \frac{GLA_S}{GLA_C} \leq \frac{3}{2}$$

(4) Age similarity may be determined according to the following Table 1:

TABLE 1

| Subject Age | 0-2 | 3-5 | 6-10 | 11-20 | 21-40 | 41-65 | 65+ |
|---|---|---|---|---|---|---|---|
| Acceptable Comp Age | 0-5 | 0-10 | 2-20 | 5-40 | 11-65 | 15-80 | 45+ |

(5) Lot size similarity may be determined according to the following Table 2:

TABLE 2

| Subject Lot size | <2000 sqft | 2000-4000 sqft | 4000 sqft-3 acres | >3 acres |
|---|---|---|---|---|
| Acceptable Comp Lot | 1-4000 sqft | 1-8000 sqft | $\frac{2}{5} \leq \frac{LOT_S}{LOT_C} \leq \frac{5}{2}$ | >1 acre |

These exclusion rules are provided by way of example. There may be a set of exclusion rules that add variables, that omit one or more the described variables, or that use different thresholds or ranges.

(iii) Adjustment of Comps

Given the pool of comps selected by the model, the sale price of each comp may then be adjusted to reflect the difference between a given comp and the subject in each of the characteristics used in the hedonic price equation.

For example, individual adjustments are given by the following set of equations (2):

$A_{gla} = \exp[(\ln(GLA_S) - \ln(GLA_C)) \cdot \beta_{gla}];$ $A_{lot} = \exp[(\ln(LOT_S) - \ln(LOT_C)) \cdot \beta_{lot}];$ $A_{age} = \exp[(\ln(AGE_S) - \ln(AGE_C)) \cdot \beta_{age}];$ $A_{bath} = \exp[(BATH_S - BATH_C) \cdot \beta_{age}];$ $A_{loc} = \exp[LOC_S - LOC_C];$ $A_{time} = \exp[TIME_S - TIME_C];$ and $A_{fcl} = \exp[FCL_S - FCL_C],$ (Eq. 2)

where coefficients βgla, βlot, βage, βbath, LOC, TIME, FCL are obtained from the hedonic price equation described above. Hence, the adjusted price of the comparable sales is summarized as:

$$p_C^{adj} = p_C \cdot \prod_{i \in \{gla, lot, age, bath, loc, time, fcl\}} A_i = p_C \cdot A_{TOTAL} \quad \text{(Eq. 3)}$$

(iv) Weighting of Comps and Value Prediction

Because of unknown neighborhood boundaries and potentially missing data, the pool of comparables will likely include more than are necessary for the best value prediction in most markets. The adjustments described above can be quite large given the differences between the subject property and comparable properties. Accordingly, rank ordering and weighting are also useful for the purpose of value prediction.

The economic distance $D_{eco}$ between the subject property and a given comp may be described as a function of the differences between them as measured in dollar value for a variety of characteristics, according to the adjustment factors described above.

Specifically, the economic distance may be defined as a Euclidean norm of individual percent adjustments for all characteristics used in the hedonic equation:

$$D_{SC}^{eco} = \sqrt{\sum_{i \in \{gla, lot, age, bath, loc, time, fcl\}} (A_i - 1)^2} \quad \text{(Eq. 4)}$$

The comps are then weighted. Properties more similar to the subject in terms of physical characteristics, location, and time of sale are presumed better comparables and thus are preferably accorded more weight in the prediction of the subject property value. Accordingly, the weight of a comp may be defined as a function inversely proportional to the economic distance, geographic distance and the age of sale.

For example, comp weight may be defined as:

$$w_C = \frac{1}{D_{SC}^{eco} \cdot D_{SC}^{eco} \cdot dT_{SC}} \quad \text{(Eq. 5)}$$

where $D_{geo}$ is a measure of a geographic distance between the comp and the subject, defined as a piece-wise function:

$$D_{SC}^{geo} = \begin{cases} 0.1 & \text{if } d_{SC} < 0.1 \text{ mi} \\ d_{SC} & \text{if } 0.1 \text{ mi} \leq d_{SC} \leq 1.0 \text{ mi} \\ 1.0 + \sqrt{d_{SC} - 1.0} & \text{if } d_{SC} > 1.0 \text{ mi,} \end{cases} \quad \text{(Eq. 6)}$$

and dT is a down-weighting age of comp sale factor $$dT_{SC} = \begin{cases} 1.00 & \text{if } (0, 90] \text{ days} \\ 1.25 & \text{if } (90, 180] \text{ days} \\ 2.00 & \text{if } (180, 270] \text{ days} \\ 2.50 & \text{if } (270, 365] \text{ days.} \end{cases} \quad \text{(Eq. 7)}$$

Comps with higher weight receive higher rank and consequently contribute more value to the final prediction, since the predicted value of the subject property based on comparable sales model is given by the weighted average of the adjusted price of all comps:

$$\hat{p}_S = \frac{\sum_{C=1}^{N_{COMPS}} w_C \cdot p_C^{adj}}{\sum_{C=1}^{N_{COMPS}} w_C} \quad \text{(Eq. 8)}$$

As can be seen from the above, the separate weighting following the determination of the adjustment factors allows added flexibility in prescribing what constitutes a good comparable property. Thus, for example, policy factors such as those for age of sale data or location may be separately instituted in the weighting process. Although one example is illustrated it should be understood that the artisan will be free to design the weighting and other factors as necessary.

(v) Listing and Mapping of Comparable Properties

The comparable properties may then be listed according to the weighting, or a ranking from the highest weighted comparable property to the lowest. This listing may be variously limited to accommodate listing them within a display area. For example, a default setting might be 20 comparable properties. The overall list of comparable properties includes, of course, the model-chosen comparable properties. The overall list will also presumably include all of the appraiser-chosen comparables, although if the comparables are chosen in particularly poor fashion, this may not be the case. In that instance the appraiser-chosen comparables may be listed at the bottom of the ranked listing, potentially with indicia that the model failed to even identify them as being within the appropriate pool of comparables.

According to another aspect, mapping and analytical tools that implement the comparable model are provided. Mapping features allow the subject property and comparable properties to be concurrently displayed. Additionally, a table or grid of data for the subject properties is concurrently displayable so that the list of comparables can be manipulated, with the indicators on the map image updating accordingly.

For example, mapping features include the capability to display the boundaries of census units, school attendance zones, neighborhoods, as well as statistical information such as median home values, average home age, etc.

The grid/table view allows the user to sort the list of comparables on rank, value, size, age, or any other dimension. Additionally, the rows in the table are connected to the full database entry as well as sale history for the respective property. Combined with the map view and the neighborhood statistics, this allows for a convenient yet comprehensive interactive analysis of comparable sales.

With further reference to the figures, examples of environments and particular embodiments implementing the ranking and displaying of comparable properties are now further described.

FIGS. 1A-B are block diagrams illustrating examples of systems 100A-B in which a comparable property analysis application operates.

FIG. 1A illustrates several user devices 102a-c each having a comparable property analysis application 104a-c.

The user devices 102a-d are preferably computer devices, which may be referred to as workstations, although they may be any conventional computing device. The network over which the devices 102a-d may communicate may also implement any conventional technology, including but not limited to cellular, WiFi, WLAN, LAN, or combinations thereof.

In one embodiment, the comparable property analysis application 104a-c is an application that is installed on the user device 102a-c. For example, the user device 102a-c may be configured with a web browser application, with the application configured to run in the context of the functionality of the browser application. This configuration may also implement a network architecture wherein the comparable property analysis applications 104a-c provide, share and rely upon the comparable property analysis application 104a-c functionality.

As an alternative, as illustrated in FIG. 1B, the computing devices 106a-c may respectively access a server 108, such as through conventional web browsing, with the server 108 providing the comparable property analysis application 110 for access by the client computing devices 106a-c. As another alternative, the functionality may be divided between the computing devices and server. Finally, of course, a single computing device may be independent configured to include the comparable property analysis application.

As illustrated in FIGS. 1A-B, property data resources 110 are typically accessed externally for use by the comparable property analysis application, since the amount of property data is rather voluminous, and since the application is configured to allow access to any county or local area in a very large geographical area (e.g., for an entire country such as the United States). Additionally, the property data resources 110 are shown as a singular block in the figure, but it should be understood that a variety of resources, including company-internal collected information (e.g., as collected by Fannie Mae), as well as external resources, whether resources where property data is typically found (e.g., MLS, tax, etc.), or resources compiled by an information services provider (e.g., Lexis).

The comparable property analysis application accesses and retrieves the property data from these resources in support of the modeling of comparable properties as well as the rendering of map images of subject properties and corresponding comparable properties, and the display of supportive data (e.g., in grid form) in association with the map images.

Figure 2:
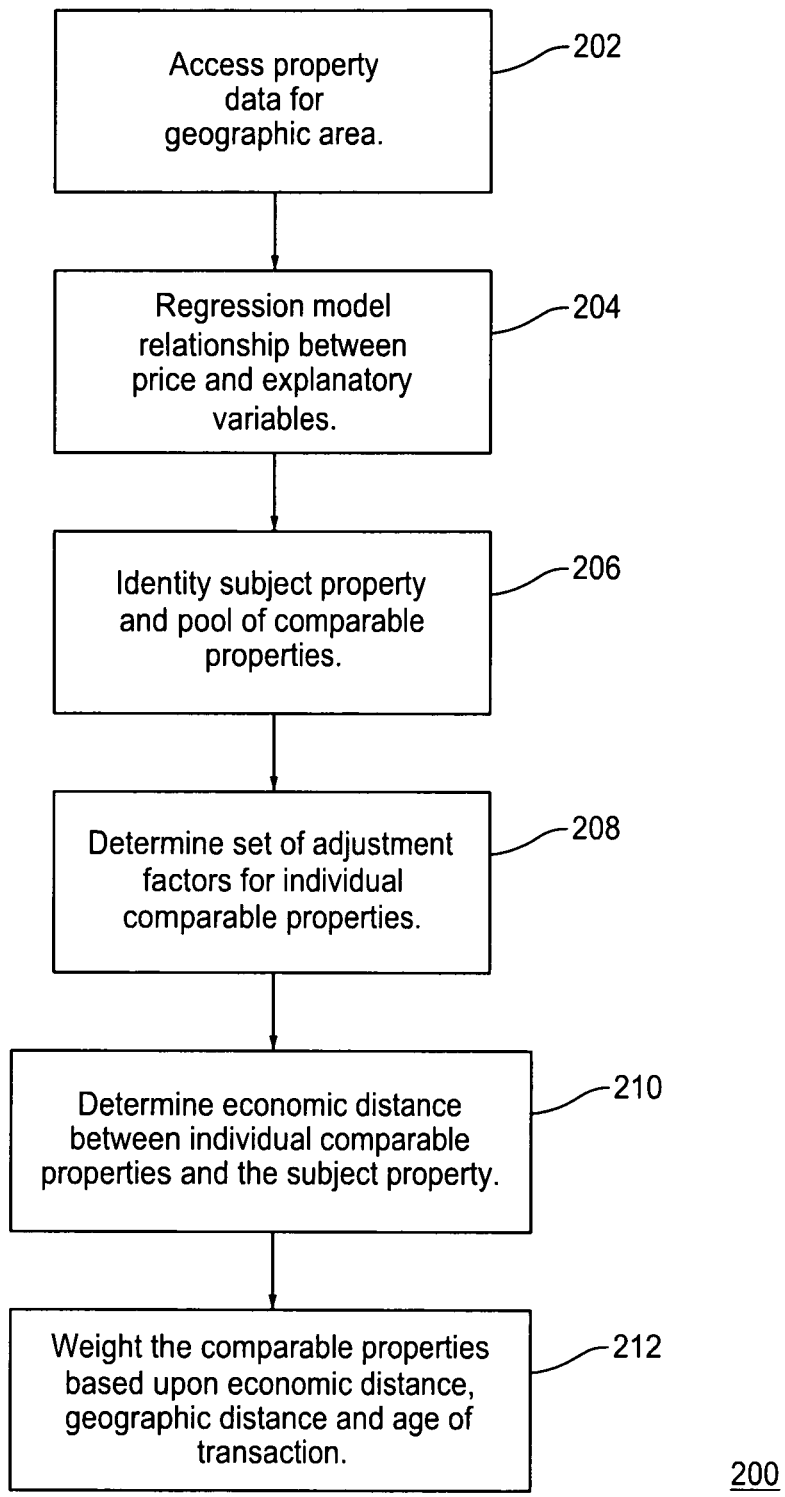
FIG. 2 is a flow diagram illustrating an example of a process for modeling comparable properties.

FIG. 2 is a flow diagram illustrating an example of a process 200 for modeling comparable properties, which may be performed by the comparable property analysis application.

As has been described, the application accesses 202 property data. This is preferably tailored at a geographical area of interest in which a subject property is located (e.g., county). A regression 204 modeling the relationship between price and explanatory variables is then performed on the accessed data. Although various alternatives may be applied, a preferred regression is that described above, wherein the explanatory variables are the four property characteristics (GLA, lot size, age, number of bathrooms) as well as the categorical fixed effects (location, time, foreclosure status).

A subject property within the county is identified 206 as is a pool of comparable properties. As described, the subject property may be initially identified, which dictates the selection and access to the appropriate county level data. Alternatively, a user may be reviewing several subject properties within a county, in which case the county data will have been accessed, and new selections of subject properties prompt new determinations of the pool of comparable properties for each particular subject property.

The pool of comparable properties may be initially defined using exclusion rules. This limits the unwieldy number of comparables that would likely be present if the entire county level data were included in the modeling of the comparables.

Although a variety of exclusion rules can be used, in one example they may include one or more of the following: (1) limiting the comparable properties to those within the same census tract as the subject property (or, the same census tract and any adjacent tracts); (2) including only comparable properties where the transaction (e.g., sale) is within 12 months of the effective date of the appraisal or transaction (sale); (3) requiring GLA to be within a range including that of the subject property (e.g., +/−50% of the GLA of the subject property); (4) requiring the age of the comparable properties to be within an assigned range as determined by the age of the subject property (e.g., as described previously); and/or (5) requiring the lot size for the comparable properties to be within an assigned range as determined by the lot size of the subject property (e.g., as described previously).

Once the pool is so-limited, a set of adjustment factors is determined 208 for each remaining comparable property. The adjustment factors may be a numerical representation of the price contribution of each of the explanatory variables, as determined from the difference between the subject property and the comparable property for a given explanatory variable. An example of the equations for determining these individual adjustments has been provided above.

Once these adjustment factors have been determined 208, the "economic distance" between the subject property and respective individual comparable properties is determined 210. The economic distance is preferably constituted as a quantified value representative of the estimated price difference between the two properties as determined from the set of adjustment factors for each of the explanatory variables.

Following determining of the economic distance, the comparable properties are weighted 212 in support of generating a ranking of the comparable properties according to the model. A preferred weighting, described previously, entails a function inversely proportional to the economic distance, geographic distance and age of transaction (typically sale) of the comparable property from the subject property.

The weights may further be used to calculate an estimated price of the subject property comprising a weighted average of the adjusted price of all of the comparable properties.

Once the model has performed the regression, adjustments and weighting of comparables, the information is conveyed to the user in the form of grid and map image displays to allow convenient and comprehensive review and analysis of the set of comparables.

Figure 3:
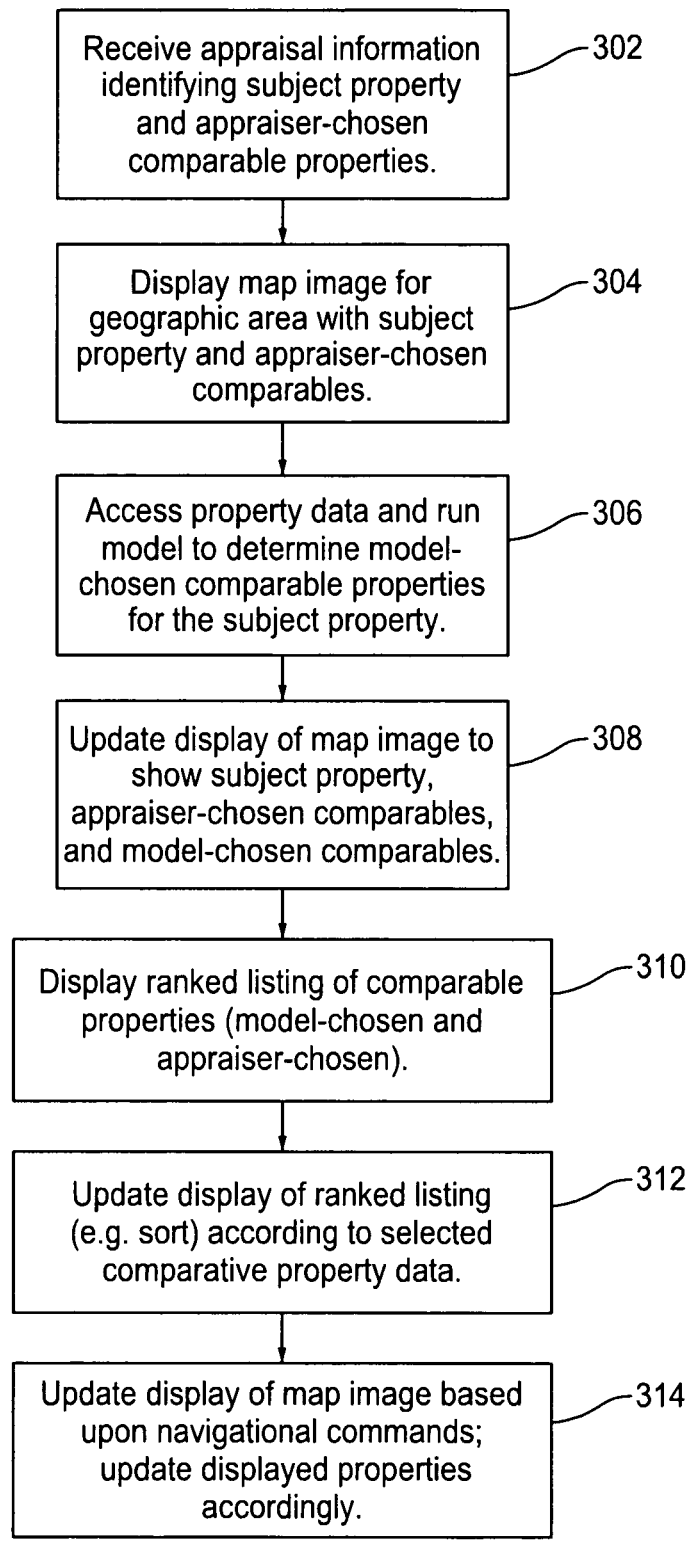
FIG. 3 is a flow diagram illustrating an example of a method for ranking and displaying appraiser-chosen comparable properties.

FIG. 3 is a flow diagram illustrating an example of a method 300 for ranking and displaying appraiser-chosen comparable properties.

The method 300 may initiate with receiving 302 appraisal information identifying a subject property and corresponding appraiser-chosen comparable properties. This appraisal information will often be accessible through a variety of data resources for appraisal reports, which list a relatively short list of comparable properties deemed appropriate for a subject property by an appraiser. Although typically human appraisal reports will be accessed and assessed, any type of appraisal information resource may be accessed and assessed. The appraisal information may be organized in a database, with access to external databases, with a search and retrieval functionality that may be based upon source, date, identification number or other criteria.

Once a set of appraisal information is chosen, the subject property and corresponding appraiser-chosen comparables may be displayed 304 on a map image with indicators showing the subject property and the locations of the comparables. This map image may be acquired from conventional mapping resources, including but not limited to Google maps and the like. Additionally, conventional techniques may be used to depict subject and comparable properties on the map image, such as through determination of the coordinates from address information.

The map imagery may be updated to provide user-desired views, including zooming in and out to provide more narrow or broad perspectives of the depictions of the comparable and subject properties. In addition to the map image, a corresponding grid of comparative property data concerning the listed properties may be concurrently displayed.

The property data includes information as to the location of the properties, and either this native data may be used, or it may be supplemented, to acquire the exact location of the subject property and potential comparable properties on the map image. This allows the map image to be populated with indicators that display the location of the subject property and the comparable properties in visually distinguishable fashion on the map image. The number of comparable properties that are shown can be predetermined or may be configurable based upon user preferences. The number of comparable properties that are shown may also update depending upon the level of granularity of the mage image. That is, when the user updates the map image such as by zooming out to encompass a wider geographical area, when the map image updates additional comparable properties may be rendered in addition to those rendered at a more local range.

The user may also prompt a particular comparable property to be highlighted, such as by cursor rollover or selection of an entry for the comparable property in a listing. When the application receives an indication that a property has been selected, it is highlighted in the map. Conversely, the user may also select the indicator for a property on the map image, which causes display of the details corresponding to the selected property.

At this stage, the appraiser-chosen comparable properties may be thoroughly assessed based upon review of the map image and the corresponding comparative property data for the appraiser-chosen comparables. However, a model-chosen listing of comparable properties is also preferably generated and depicted for further comparison to and assessment of the appraiser-chosen comparable properties.

Initially, this entails accessing property data and running a model (306) to determine model-chosen comparable properties for the subject property. In one example, the model may be the described hedonic regression performed at a geographic level (e.g., county) sufficient to produce reliable results. As set forth in further detail above, the described model identifies a pool of comparables, determines adjustments for each comparable using adjustment factors drawn from the regression analysis, derives an economic distance between each comparable and the subject property, and weights the comparables according to the economic distance between the comparable and the subject property. This weighting can be used to determine a ranked listing, with the highest weighting being the closest-ranked comparable, and so on. Although the particulars of one model are described herein, it should be understood that alternative particulars may be implemented according to the present invention.

The model produces a set of model-chosen comparable properties. The map image display is preferably updated 308 to indicate not only the subject property and the appraiser-chosen comparables, but also the additional model-chosen comparables. Preferably, the subject property, appraiser-chosen comparables and model-chosen comparables are depicted using different indicators, so that the user can identify the different properties and their locations on the map image. If necessary, the map image may automatically adjust for this update, such as in situations where a wider area is needed to concurrently depict the subject, appraiser and model-chosen comparables properties.

The listing of comparative property data is also updated 310 to display the ranked listing of the model-chosen comparable properties. This ranked listing will include both appraiser-chosen comparable properties, depending upon where they fall in the ranking, as well as model-chosen comparable properties that were not selected by the appraiser. The ranked listing provides an immediate indication as to how appropriate the model indicates the appraiser-chosen comparable properties to be as comparable for the subject property.

As with the listing before the update, the list may be variously updated 312 to sort and review the comparative data for the listed properties, for "drill down" assessment of the appropriateness of the appraiser-chosen comparable properties. Preferably, the listing is concurrently displayed with the map image to highlight location of selected properties while they are being reviewed.

Additionally, the map image may be further updated 314 to assess geographical areas at various levels of granularity (e.g., zoom in upon the neighborhood of the subject property, or zoom out to review potential comparable properties for a broader geographical area). The map image updates accordingly, both as to the map image and the inclusion of indicators for the subject and comparable properties.

Figure 4:
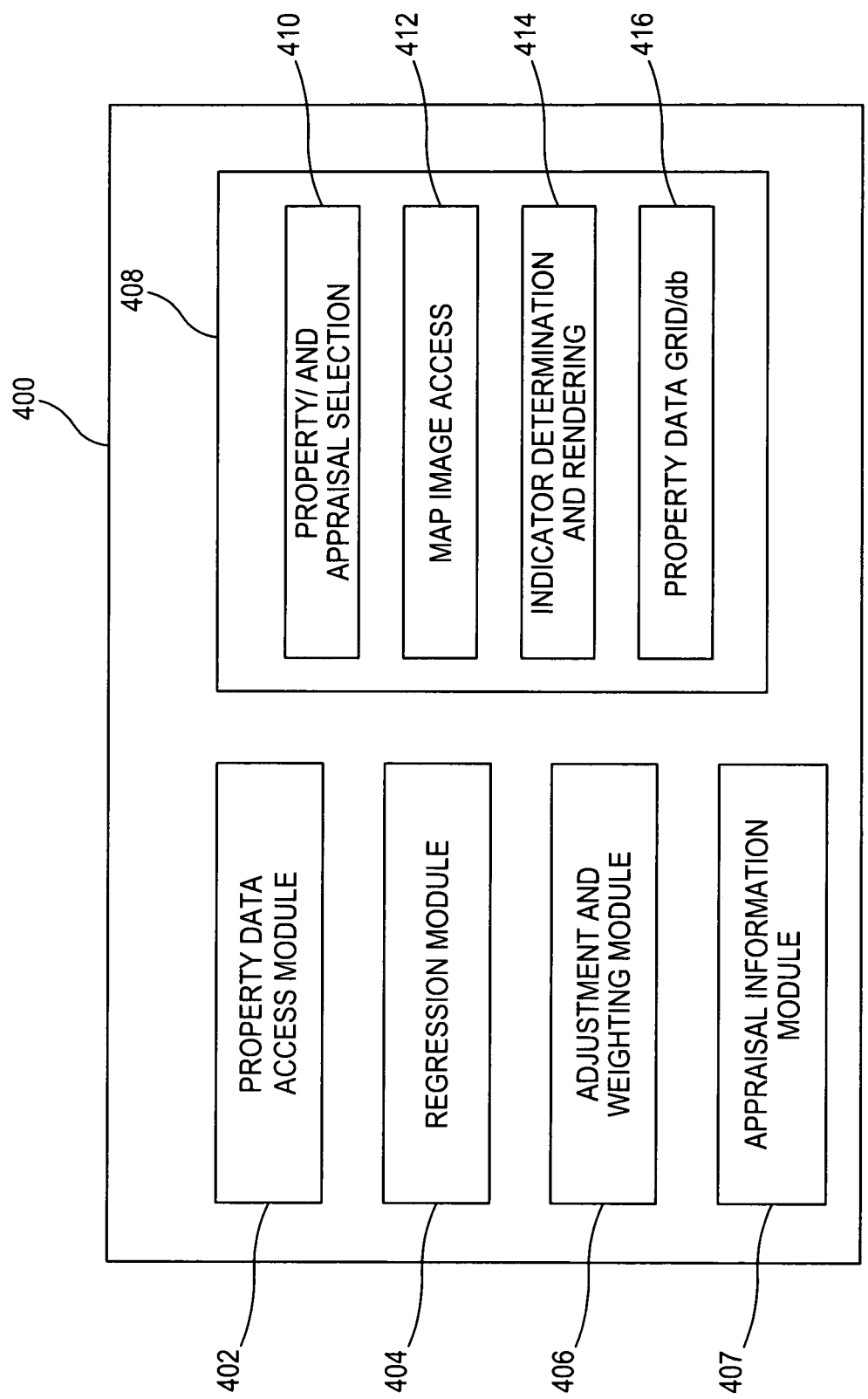
FIG. 4 is a block diagram illustrating an example of a comparable property analysis application.

FIG. 4 is a block diagram illustrating an example of a comparable property analysis application 400. The application 400 preferably comprises program code that is stored on a computer readable medium (e.g., compact disk, hard disk, etc.) and that is executable by a processor to perform operations in support of modeling and mapping comparable properties.

According to one aspect, the application includes program code executable to perform operations of accessing property data corresponding to a geographical area, and performing a regression based upon the property data, with the regression modeling the relationship between price and explanatory variables. A subject property and a plurality of comparable properties are identified, followed by determining a set of value adjustments for each of the plurality of comparable properties based upon differences in the explanatory variables between the subject property and each of the plurality of comparable properties. An economic distance between the subject property and each of the comparable properties is determined, with the economic distance constituted as a quantified value determined from the set of value adjustments for each respective comparable property. Once the properties are identified and the adjustments are determined, there is a weighting of the plurality of comparable properties based upon the appropriateness of each of the plurality of comparable properties as comparables for the subject property, the weighting being based upon one or more of the economic distance from the subject property, geographic distance from the subject property, and age of transaction.

The application 400 also includes program code for displaying a map image corresponding to the geographical area, and displaying indicators on the map image indicative of the subject property and at least one of the plurality of comparable properties, as well as ranking the plurality of comparable properties based upon the weighting, and displaying a text listing of the plurality of comparable properties according to the ranking.

The application 400 also includes program code for ranking and displaying comparable properties. Appraisal information is accessed, so as to identify a given subject property and corresponding appraiser-chosen comparable properties for the subject property. The modeling functionality previously described determines a plurality of model-chosen comparable properties based upon the appropriateness of each of the plurality of comparable properties as comparables for the subject property. Thereby, a map image corresponding to the geographical area is displayed, as well as indicators on the map image indicative of the subject property, at least one of the plurality of appraiser-chosen comparable properties, and at least one of the model-chosen comparable properties. In addition to the map image, the application 400 determines the ranked listing of comparable properties including the plurality of model-chosen comparable properties and the plurality of appraiser-chosen comparable properties, and displaying the ranked listing of comparable properties concurrently with the map image, such as in the described grid form.

The comparable property analysis application 400 is preferably provided as software, but may alternatively be provided as hardware or firmware, or any combination of software, hardware and/or firmware. The application 400 is configured to provide the comparable property modeling, appraisal results comparing and corresponding mapping functionality described herein. Although one modular breakdown of the application 400 is offered, it should be understood that the same functionality may be provided using fewer, greater or differently named modules.

The example of the comparable property analysis application 400 of FIG. 4 includes a property data access module 402, regression module 404, adjustment and weighting module 406, appraisal information module 407, and UI module 408, with the UI module 408 further including a property and appraisal selection module 410, map image access module 412, indicator determining and rendering module 414 and property data grid/DB module 416.

The property data access module 402 includes program code for carrying access and management of the property data, whether from internal or external resources. The regression module 404 includes program code for carrying out the regression upon the accessed property data, according to the regression algorithm described above, and produces corresponding results such as the determination of regression coefficients and other data at the country (or other) level as appropriate for a subject property. The regression module 404 may implement any conventional code for carrying out the regression given the described explanatory variables and property data.

The adjustment and weighting module 406 is configured to apply the exclusion rules, and to calculate the set of adjustment factors for the individual comparables, the economic distance, and the weighting of the comparables.

The appraisal information module 407 may be a stand-alone database or may organize access to a variety of external databases of appraisal information. The appraisal information is typically in the form of appraisal reports for subject properties, wherein a set of comparable properties chosen by an appraiser is listed. The appraisal information may be retrieved based upon a variety of criteria, including search by subject property, identification number, or characteristics (appraiser ID, vendor, date, etc.).

The UI module 408 manages the display and receipt of information to provide the described functionality. It includes a property and appraisal selection module 410, to manage the interfaces and input used to identify one or more subject properties and corresponding appraisal information. The map image access module 412 accesses mapping functions and manages the depiction of the map images as well as the indicators of the subject property and the comparable properties. The indicator determination and rendering module 414 is configured to manage which indicators should be indicated on the map image depending upon the current map image, the weighted ranking of the comparables and predetermined settings or user input. The property data grid/DB 416 manages the data set corresponding to a current session, including the subject property and pool of comparable properties. It is configured as a database that allows the property data for the properties to be displayed in a tabular or grid format, with various sorting according to the property characteristics, economic distance, geographical distance, time, etc.

Figure 5B:
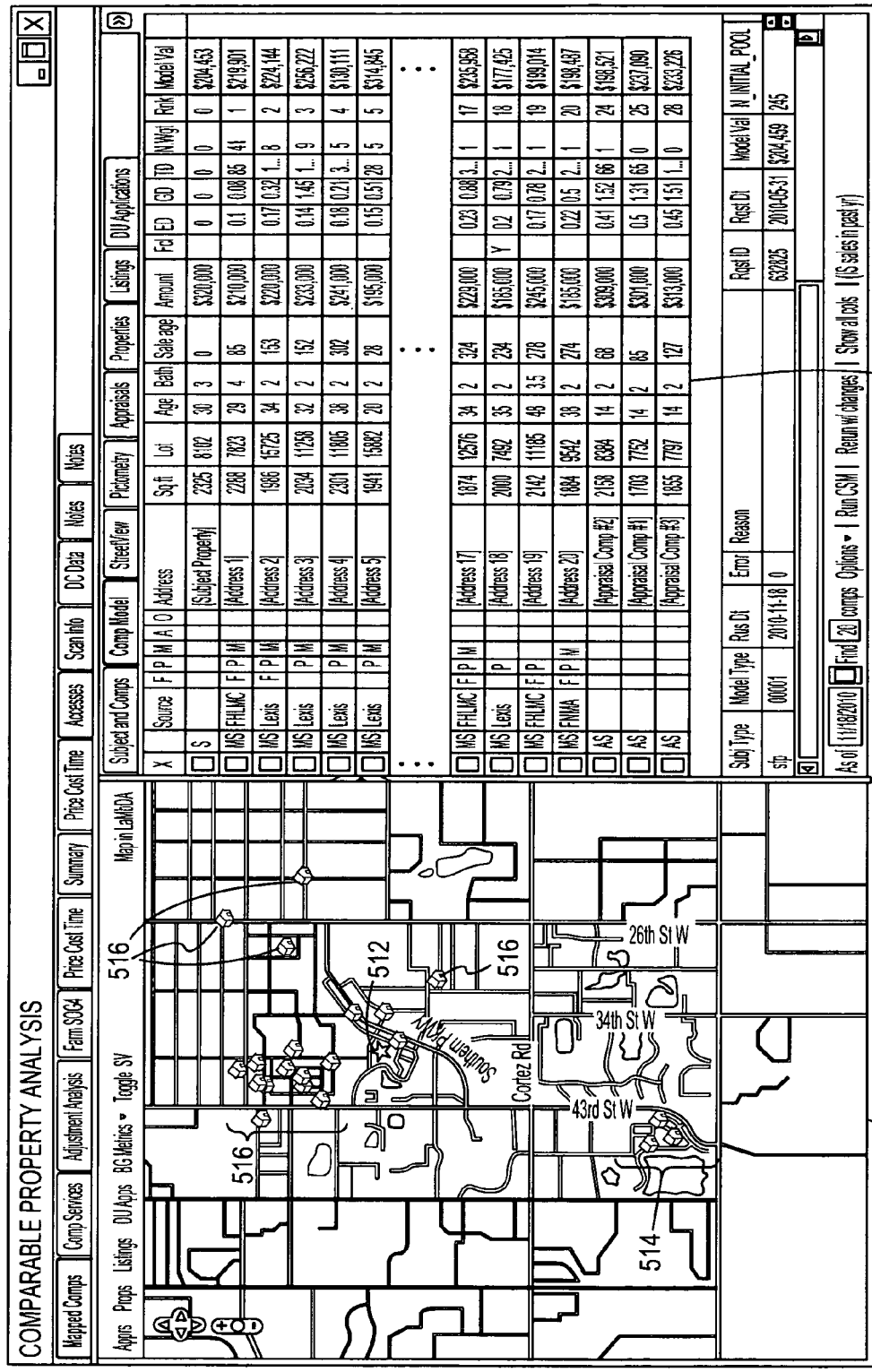
FIG. 5B is a display diagram illustrating an example of a map image and property grid data updated to indicate appraiser-chosen comparable properties among a ranked listing of model-chosen comparable properties.

FIG. 5A is a display diagram illustrating an example of a map image 510*a* and corresponding property grid data 520*a* for a list of appraiser-chosen comparable properties, and FIG. 5B is a display diagram illustrating an example of a map image 510*a* and property grid data 520*b* updated to indicate appraiser-chosen comparable properties among a ranked listing of model-chosen comparable properties.

The map image 510*a-b* depicts a region that can be manipulated to show a larger or smaller area, or moved to shift the center of the map image, in convention fashion. This allows the user to review the location of the subject property 512 and corresponding comps 514, 516 at any desired level of granularity. This map image 510*a-b* may be separately viewed on a full screen, or may be illustrated alongside the property data grid 520*a-b* as shown.

The property grid data 520*a-b* contains a listing of details about the subject property and the comparable properties, as well as various information fields. The fields include an identifier field (e.g., "S" indicates the subject property, "AS" indicates an appraiser-chosen comparable property, and "MS" indicates a model-chosen comparable property), the source of data for the property ("Source"), the address of the property ("Address"), the square footage ("Sq Ft"), the lot size ("Lot"), the age of the property ("Age"), the number of bathrooms ("Bath"), the age of the prior sale ("Sale Age"), the prior sale amount ("Amount"), the foreclosure status ("FCL", y/n), the economic distance ("ED"), geographic distance ("GD") and time distance ("TD", e.g., as measured in days) factors as described above, the weight ("N. Wgt"), the ranking by weight ("Rnk"), and the valuation as determined from the comparable sales model ("Model Val").

Initially, a user may navigate through an appraisal selection screen that allows the user to identify and select an appraisal report for a subject property. Once this report is selected, the map image 510*a-b* and property grid data 520*a-b* may be prompted accordingly, such that the subject property and the appraiser-chosen comparable properties are listed and displayed.

For example, FIG. 5A illustrates an example of a display screen 500*a* that concurrently displays a map image 510*a* and a corresponding property data grid 520*a* once an appraisal report for a subject property has been selected. As indicated in the property grid data, the listing identified as "S" is the subject property, and the listings identified as "AS" indicate appraiser-chosen comparable properties. The subject property 512 and appraiser-chosen comparable properties 514 are indicated in the map image as well.

The updated display screen 500*b* of FIG. 5B may be displayed following execution of the comparable property model, which identifies the comparable properties, determines adjustment factors, determines economic distance and weights the comparable properties, such as described above. At this point, the map image 510*b* is updated to include not only the subject property 512 and appraiser-chosen comparable properties 514, but also the model-chosen properties 516 that were not in the appraisal report. Similarly, the property data grid 520*b* updates to include the model-chosen properties that were not in the appraisal report ("MS"). As illustrated, here, the model ranked the appraiser-chosen comparables as $24^{th}$, $25^{th}$ and $26^{th}$ among the properties it determined to be appropriate comparables. The listing also indicates the top 20 model-chosen comparable properties. Additionally, the map image 510*b* indicates that the appraiser-chosen comparable properties 514 are further geographically from the subject property than are many of the model-chosen properties 516.

Further assessment of the data can be variously undertaken by the user. The map image 510 also allows the user to place a cursor over any of the illustrated properties to prompt highlighting of information for that property and other information. Additionally, the listing of comparables in the property grid data 520 can be updated according to any of the listed columns. The grid data can be variously sorted to allow the user to review how the subject property compares to the listed comparable properties.

Still further, the map image 510 can be divided into regions to help further assess the location of the subject property and corresponding properties. For example, the map image can be updated to indicate several Census Block Group (CBG) regions in the map image, along with trend or other data particular to each CBG. This helps the user to further assess how the subject property relates to the comparable properties, with the CBG acting as a proxy for neighborhood. By way of example, the map image 510 of FIG. 5B illustrates several CBG separated by darker lines. As can be seen many of the most higher ranked model-chosen properties 516 reside in the same CBG as the subject property, whereas the appraiser-chosen comparable properties 514 reside in a different, distant CBG. Still further, the map image 510 indicates proximity of the appraiser-chosen comparable properties 514 to an important value-affecting feature (a lake) whereas the subject property and the closest model-chosen comparable properties are resident relatively distant from the important feature. This visual comparison concurrent with the presentation of the raw data in the grid allows a powerful and efficient assessment of the comparable properties.

The user may variously update the map image and manipulate the property data grid in order to review and assess and subject property and the corresponding comparable properties in a fashion that is both flexible and comprehensive.

Thus embodiments of the present invention produce and provide methods and apparatus for ranking and displaying appraiser-chosen and model-chosen comparable properties. Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. A method for evaluating an already completed appraisal of a subject property, the appraisal having used as comparable properties a first set of properties selected by an appraiser that performed the appraisal, the method comprising:

receiving appraisal information from a previously established appraisal report of the appraisal, the appraisal information identifying the subject property and the first set of properties, using an automated valuation model to determine a ranked list of the N best properties for use as comparable properties in valuing the subject property;

displaying a map image of a corresponding geographic area on a display page, the corresponding geographical area encompassing the subject property, the map image including:

first indicators that mark locations of those properties included in the first set of properties;

second indicators, distinguishably different from the first indicators, that mark locations of those properties that are included in the ranked list but that are not included in the first set of properties; and a third indicator, distinguishably different from the first and second indicators, that marks the location of the subject property; and displaying the ranked listing concurrently with the map image in such a manner that those properties in the ranked list that are also included in the first set of properties are distinguishable from those properties in the ranked list that are not included in the first set of properties wherein displaying the map image comprises automatically updating the map image on the display page by widening the corresponding geographical area to include each of the first indicators, the second indicators and the third indicator to concurrently depict appraiser-chosen properties, model-chosen properties and the subject property.

2. The method of claim 1, wherein the ranked listing includes a plurality of columns of comparative data regarding each of the properties in the ranked listing.

3. The method of claim 2, wherein the ranked listing is configured for selective sorting based upon the values respectively in the plurality of columns of comparative data.

4. The method of claim 1,
wherein the automated valuation model performs a regression based upon property data, the regression modeling the relationship between price and explanatory variables, wherein the price is a dependent variable and the explanatory variables comprise a plurality of property characteristics.

5. The method of claim 4,
wherein the automated valuation model ranks properties according to their suitability for use as comparable properties in valuing the subject property by:
identifying a second set of properties that are candidate comparable properties;
determining, for each candidate comparable property in the second set of properties, a set of value adjustments based upon differences in the explanatory variables between the subject property and the respective candidate comparable property;
determining, for each candidate comparable property in the second set of properties, an economic distance between the subject property and the respective candidate comparable property, the economic distance being based on the sum of the set of value adjustments for the respective property; and
ranking the candidate comparable properties based upon a weighting of the candidate comparable properties based upon the economic distance from the subject property.

6. A non-transitory computer readable medium storing program code thereon that is configured to, when executed by a computing system, cause the computing system to perform operations for evaluating an already completed appraisal of a subject property, the appraisal having used as comparable properties a first set of properties selected by an appraiser that performed the appraisal, the operations comprising:
receiving appraisal information from a previously established appraisal report of the appraisal, the appraisal information identifying the subject property and the first set of properties,
using an automated valuation model to determine a ranked list of the N best properties for use as comparable properties in valuing the subject property;
displaying a map image of a corresponding geographic area on a display page, the corresponding geographical area encompassing the subject property, the map image including:
first indicators that mark locations of those properties included in the first set of properties;
second indicators, distinguishably different from the first indicators, that mark locations of those properties that are included in the ranked list but that are not included in the first set of properties; and
a third indicator, distinguishably different from the first and second indicators, that marks the location of the subject property; and
displaying the ranked listing concurrently with the map image in such a manner that those properties in the ranked list that are also included in the first set of properties are distinguishable from those properties in the ranked list that are not included in the first set of properties wherein displaying the map image comprises automatically updating the map image on the display page by widening the corresponding geographical area to include each of the first indicators, the second indicators and the third indicator to concurrently depict appraiser-chosen properties, model-chosen properties and the subject property.

7. The non-transitory computer readable medium of claim 6, wherein the ranked listing includes a plurality of columns of comparative data regarding each of the properties in the ranked listing.

8. The non-transitory computer readable medium of claim 7, wherein the ranked listing is configured for selective sorting based upon the values respectively in the plurality of columns of comparative data.

9. The non-transitory computer readable medium of claim 6,
wherein the automated valuation model performs a regression based upon property data, the regression modeling the relationship between price and explanatory variables, wherein the price is a dependent variable and the explanatory variables comprise a plurality of property characteristics.

10. The non-transitory computer readable medium of claim 9,
wherein the automated valuation model ranks properties according to their suitability for use as comparable properties in valuing the subject property by:
identifying a second set of properties that are candidate comparable properties;
determining, for each candidate comparable property in the second set of properties, a set of value adjustments based upon differences in the explanatory variables between the subject property and the respective candidate comparable property;
determining, for each candidate comparable property in the second set of properties, an economic distance between the subject property and the respective candidate comparable property, the economic distance being based on the sum of the set of value adjustments for the respective property; and
ranking the candidate comparable properties based upon a weighting of the candidate comparable properties based upon the economic distance from the subject property.

11. A computing system, comprising:
a processor; and
a non-transitory computer readable medium storing program code thereon that is configured to, when executed by the processor, cause the computing system to perform operations for evaluating an already completed appraisal of a subject property, the appraisal having used as comparable properties a first set of properties selected by an appraiser that performed the appraisal, the operations comprising:
receiving appraisal information from a previously established appraisal report of the appraisal, the appraisal information identifying the subject property and the first set of properties,
using an automated valuation model to determine a ranked list of the N best properties for use as comparable properties in valuing the subject property;
displaying a map image of a corresponding geographic area on a display page, the corresponding geographical area encompassing the subject property, the map image including:
first indicators that mark locations of those properties included in the first set of properties;
second indicators, distinguishably different from the first indicators, that mark locations of those properties that are included in the ranked list but that are not included in the first set of properties; and a third indicator, distinguishably different from the first and second indicators, that marks the location of the subject property; and displaying the ranked listing concurrently with the map image in such a manner that those properties in the ranked list that are also included in the first set of properties are distinguishable from those properties in the ranked list that are not included in the first set of properties wherein displaying the map image comprises automatically updating the map image on the display page by widening the corresponding geographical area to include each of the first indicators, the second indicators and the third indicator to concurrently depict appraiser-chosen properties, model-chosen properties and the subject property.

12. The computing system of claim 11, wherein the ranked listing includes a plurality of columns of comparative data regarding each of the properties in the ranked listing.

13. The computing system of claim 12, wherein the ranked listing is configured for selective sorting based upon the values respectively in the plurality of columns of comparative data.

14. The computing system of claim 11,
wherein the automated valuation model performs a regression based upon property data, the regression modeling the relationship between price and explanatory variables, wherein the price is a dependent variable and the explanatory variables comprise a plurality of property characteristics.

15. The computing system of claim 14,
wherein the automated valuation model ranks properties according to their suitability for use as comparable properties in valuing the subject property by:
identifying a second set of properties that are candidate comparable properties;
determining, for each candidate comparable property in the second set of properties, a set of value adjustments based upon differences in the explanatory variables between the subject property and the respective candidate comparable property;
determining, for each candidate comparable property in the second set of properties, an economic distance between the subject property and the respective candidate comparable property, the economic distance being based on the sum of the set of value adjustments for the respective property; and
ranking the candidate comparable properties based upon a weighting of the candidate comparable properties based upon the economic distance from the subject property.

* * * * *